(12) United States Patent
Choi et al.

(10) Patent No.: US 9,853,010 B2
(45) Date of Patent: Dec. 26, 2017

(54) METHOD OF FABRICATING A SEMICONDUCTOR PACKAGE

(71) Applicant: ELECTRONICS AND TELELCOMMUNICATIONS RESEARCH INSTITUTE, Daejeon (KR)

(72) Inventors: Kwang-Seong Choi, Daejeon (KR); Hyun-cheol Bae, Daejeon (KR); Yong Sung Eom, Daejeon (KR); Jin Ho Lee, Daejeon (KR); Haksun Lee, Daejeon (KR)

(73) Assignee: ELECTGRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 2 days.

(21) Appl. No.: 14/958,341

(22) Filed: Dec. 3, 2015

(65) Prior Publication Data
US 2017/0141071 A1   May 18, 2017

(30) Foreign Application Priority Data
Nov. 17, 2015   (KR) .................. 10-2015-0161193

(51) Int. Cl.
*H01L 21/00* (2006.01)
*H01L 23/00* (2006.01)
(Continued)

(52) U.S. Cl.
CPC .......... *H01L 24/81* (2013.01); *H01L 21/4853* (2013.01); *H01L 21/563* (2013.01);
(Continued)

(58) Field of Classification Search
None
See application file for complete search history.

(56) References Cited

U.S. PATENT DOCUMENTS

| 6,342,577 B1 * | 1/2002 | Konarski | ........... | C08G 59/4014 257/E21.503 |
| 7,151,010 B2 | 12/2006 | Nguyen et al. | | |

(Continued)

FOREIGN PATENT DOCUMENTS

| JP | H02197373 | * | 8/1990 | ............. H01L 24/75 |
| JP | 2014-175567 A | | 9/2014 | |

(Continued)

OTHER PUBLICATIONS

R. Daily, et al., "3D IC Process Development for Enabling Chip-on-Chip and Chip on Wafer Multi-Stacking at Assembly", ICEP-IAAC 2015 Proceedings, vol. WA1-2, pp. 56-60, Apr. 14-17, 2015.

*Primary Examiner* — Reema Patel
(74) *Attorney, Agent, or Firm* — Rabin & Berdo, P.C.

(57) ABSTRACT

Provided is a method of fabricating a semiconductor package. The method includes providing a package substrate including a pad, mounting a semiconductor chip with a solder ball on the package substrate to allow the solder ball to be disposed on the pad, filling a space between the package substrate and the semiconductor chip with a underfill resin including a reducing agent comprising a carboxyl group, and irradiating the semiconductor chip with a laser to bond the solder ball to the pad, wherein the bonding of the solder ball to the pad comprises changing a metal oxide layer formed on surfaces of the pad and the solder ball to a metal layer by heat generated by the laser.

15 Claims, 12 Drawing Sheets

(51) Int. Cl.
    *H01L 21/48*     (2006.01)
    *H01L 21/56*     (2006.01)
    *H01L 25/00*     (2006.01)

(52) U.S. Cl.
    CPC .... *H01L 25/50* (2013.01); *H01L 2224/81091* (2013.01); *H01L 2224/81224* (2013.01)

(56) References Cited

U.S. PATENT DOCUMENTS

| | | | |
|---|---|---|---|
| 8,604,603 B2 | 12/2013 | Lau et al. | |
| 9,012,920 B2 | 4/2015 | Ju et al. | |
| 2009/0233402 A1* | 9/2009 | Lee | H01L 21/563 |
| | | | 438/114 |
| 2011/0133216 A1* | 6/2011 | Sugawara | H01L 33/0079 |
| | | | 257/88 |
| 2012/0077312 A1* | 3/2012 | Lee | H01L 21/563 |
| | | | 438/108 |
| 2013/0193612 A1* | 8/2013 | Watabe | H01L 21/563 |
| | | | 264/261 |
| 2014/0131855 A1* | 5/2014 | Sylvestre | H01L 24/81 |
| | | | 257/737 |

FOREIGN PATENT DOCUMENTS

| | | | | |
|---|---|---|---|---|
| KR | 10-2011-0124579 A | | 11/2011 | |
| KR | 1020120106051 | * | 9/2012 | ............. H01L 21/60 |

\* cited by examiner

METHOD OF FABRICATING A SEMICONDUCTOR PACKAGE

CROSS-REFERENCE TO RELATED APPLICATIONS

This U.S. non-provisional patent application claims priority under 35 U.S.C. §119 of Korean Patent Application No. 10-2015-0161193, filed on Nov. 17, 2015, the entire contents of which are hereby incorporated by reference.

BACKGROUND

The present disclosure herein relates to a method of fabricating a semiconductor package, and more particularly, to a method of fabricating a semiconductor package having enhanced process reliability.

As a stacked package that has been typically implemented by using a wire bonding technology needs high performance, the development of a 3D package that employs the through silicon via (TSV) technology is being performed. The 3D package is obtained by the vertical stacking of devices having various functions and may implement the expansion of memory capacity, low-power, a high transmission rate, and high efficiency.

SUMMARY

The present disclosure provides a method of fabricating a semiconductor package having enhanced process reliability.

An embodiment of the inventive concept provides a method of fabricating a semiconductor package includes providing a package substrate including a pad, mounting a semiconductor chip with a solder ball on the package substrate to allow the solder ball to be disposed on the pad, filling a space between the package substrate and the semiconductor chip with a underfill resin including a reducing agent comprising a carboxyl group, and irradiating the semiconductor chip with a laser to bond the solder ball to the pad, wherein the bonding of the solder ball to the pad comprises changing a metal oxide layer formed on surfaces of the pad and the solder ball to a metal layer by heat generated by the laser.

In an embodiment, the reducing agent may be glutaric acid, malic acid, azelaic acid, abietic acid, adipic acid, ascorbic acid, acrylic acid or citric acid.

In an embodiment, the underfill resin may further include a thermosetting resin and a hardener.

In an embodiment, the heat generated by the lasers may have a temperature of about 130° C. to about 270° C.

In an embodiment, the bonding of the solder ball to the pad may further include applying pressure to the semiconductor chip.

In an embodiment, the laser is irradiated to upper and/or lower portions of the semiconductor chip.

In an embodiment, the laser may have a wavelength of about 500 nm to about 2 µm.

In an embodiment, the method may further include, after the bonding of the solder ball to the pad, forming a first underfill resin on the semiconductor chip to cover a chip pad disposed on an upper surface of the semiconductor chip, mounting a first semiconductor chip with a first solder ball on the semiconductor chip to allow the first solder ball to be disposed in the chip pad, and bonding of the solder ball to the chip pad by using heat generated by a laser irradiated to the first semiconductor chip.

In an embodiment, the method may further include, after the bonding of the solder ball to the pad, forming a first underfill resin on the semiconductor chip to cover a chip pad disposed on an upper surface of the semiconductor chip, mounting a first semiconductor chip with the first solder ball on the semiconductor chip, applying heat to the package substrate to decrease viscosity of the first underfill resin and aligning the first semiconductor chip with the semiconductor chip to allow the first solder ball to be disposed on the chip pad, and bonding of the solder ball to the chip pad by using heat generated by a laser irradiated to the first semiconductor chip.

In an embodiment, the bonding of the first solder ball to the chip pad may include increasing the decreased viscosity of the first underfill resin.

In an embodiment, the heat applied to the package substrate may have a temperature of about 50° C. to about 180° C., and the heat generated by the laser may have a temperature of about 130° C. to about 270° C.

In an embodiment, the method may further include, before the bonding of the solder ball to the pad, providing a laser reflecting layer on an upper surface of the semiconductor chip.

In an embodiment, the laser reflecting layer may include a metal material.

In an embodiment, the method may further include, before the bonding of the solder ball to the pad, forming a bonding layer on an upper surface of the semiconductor layer; and forming an absorbing layer on the bonding layer.

In an embodiment, the changing of the metal oxide layer to the metal layer may include oxidizing the reducing agent by the heat to reduce the metal oxide layer.

Another embodiment of the inventive concept provides a method of fabricating a semiconductor package includes providing a package substrate including a pad, mounting a first semiconductor chip with a first solder ball on the package substrate to allow the first solder ball to be disposed on the pad, filling a space between the package substrate and the first semiconductor chip with a first underfill resin including a reducing agent comprising a carboxyl group, forming a second underfill resin on the first semiconductor chip to cover chip pad disposed on an upper surface of the first semiconductor chip, the second underfill resin comprising a reducing agent comprising a carboxyl group, mounting a second semiconductor chip with a second solder ball on the first semiconductor chip to allow the second solder ball to be disposed on the chip pad, and irradiating to the first and second semiconductor chips with a laser to bond the first solder ball to the pad and the second solder ball to the chip pad together, wherein the bonding of the first solder ball to the pad and the second solder ball to the chip pad together comprises changing a metal oxide layer formed on surfaces of the second solder ball and the chip pad to a metal layer by heat generated by the laser.

In an embodiments of the inventive concept, the reducing agent may be glutaric acid, malic acidazelaic acid, abietic acid, adipic acid, ascorbic acid, acrylic acid or citric acid.

In an embodiment, the laser may have a wavelength of about 500 nm to about 2 µm.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
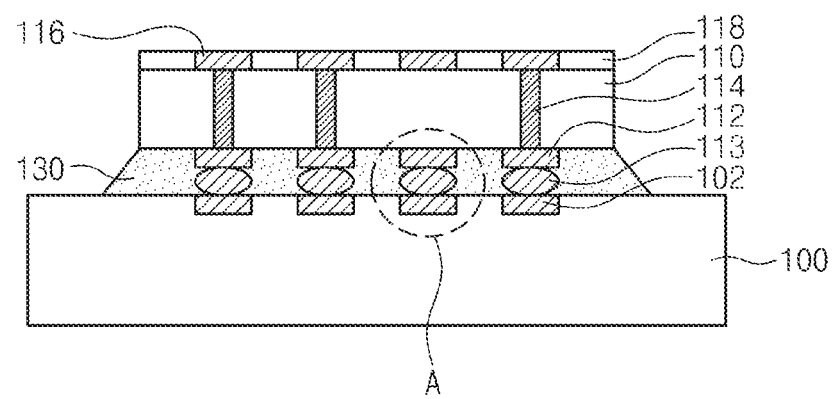
FIGS. 1A, 1C, and 1E to 1G are cross-sectional views of a method of fabricating a semiconductor package according to an embodiment of the present disclosure.

The advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided to make this disclosure complete and fully convey the scope of the present disclosure to a person skilled in the art. Further, the present disclosure is only defined by the scopes of claims. The same reference numerals throughout the disclosure refer to the same components.

The terms used herein are only for explaining embodiments, not limiting the present disclosure. The terms in a singular form in the disclosure also include plural forms unless otherwise specified. The terms used herein "comprises" and/or "comprising" do not exclude the presence or addition of one or more additional components, steps, operations and/or devices other than the components, steps, operations and/or devices that are mentioned.

Also, embodiments in the present disclosure are described with reference to ideal, exemplary cross-sectional views and/or plan views of the present disclosure. The thicknesses of layers and regions in the drawings are exaggerated for the effective description of technical content. Thus, the forms of exemplary views may vary depending on fabrication technologies and/or tolerances. Thus, embodiments of the present disclosure are not limited to shown specific forms and also include variations in form produced according to manufacturing processes. For example, an etch region shown in a rectangular shape may have a round shape or a shape having a certain curvature. Thus, regions illustrated in the drawings are exemplary, and the shapes of the regions illustrated in the drawings are intended to illustrate the specific shapes of the regions of devices and not to limit the scope of the present disclosure.

FIGS. 1A, 1C, and 1E to 1G are cross sectional views of a method of fabricating a semiconductor package according to an embodiment of the present disclosure. FIG. 1B is an enlarged view of portion A of FIG. 1A. FIG. 1D is an enlarged view of portion B of FIG. 1C.

Figure 1B:
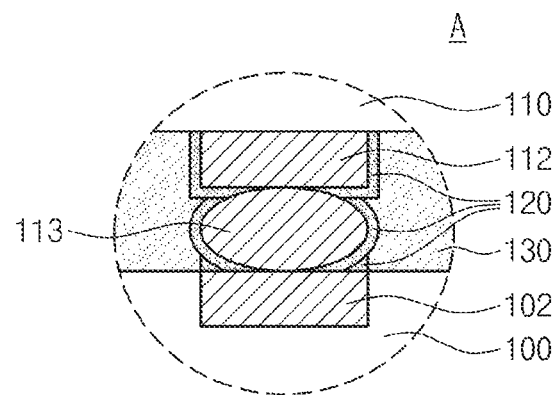
FIG. 1B is an enlarged view of portion A of FIG. 1A.

Referring to FIG. 1A, a package substrate 100 is provided which includes a pad 102. The pad 102 may be disposed on an upper surface of the package substrate 100. The package substrate 100 may be a printed circuit board (PCB), a silicon substrate or an interposer substrate. The pad 102 may include underbump metallization (UBM), such as copper (Cu) or gold (Au).

A first semiconductor chip 110 may be mounted on the package substrate 100. Mounting the first semiconductor chip 110 on the package substrate 100 may include disposing a first solder ball 113, which is disposed on a lower surface of the first semiconductor chip 110, on the pad 102. Thus, the first solder ball 113 and the pad 102 may be in contact with each other. The first solder ball 113 may be bonded to a lower pad 112 that is disposed on the lower surface of the first semiconductor chip 110. The lower pad 112 may include underbump metallization (UBM), such as copper (Cu) or gold (Au). The first solder ball 113 may include tin (Sn), indium (In), tin bismuth (SnBi), tin silver copper (SnAgCu), tine silver (SnAg), gold tin (AuSn), indium tin (InSn), or bismuth indium tin (BiInSn) The first solder ball 113 may have a size of about 1 μm to about 300 μm.

As shown in FIG. 1B, metal oxide layers 120 may be formed on some surfaces of the pad 102, the lower pad 112, and the first solder ball 113 that are exposed to the air. The metal oxide layers 120 may be formed by the combination of metal ions in the pad 102, the lower pad 112 and the first solder ball 113, with an oxygen ion in the air The first semiconductor chip 110 may include a via 114 passing through the first semiconductor chip 110, and an upper pad 116 disposed on an upper surface of the first semiconductor chip 110. The via 114 may electrically connect the lower pad 112 and the upper pad 116 or may connect the lower and upper pads 112 and 116 to a device (not shown) in the first semiconductor chip 110 The via 114 may be a through silicon via (TSV). The first semiconductor chip 110 may include a digital device, a radio frequency (RF)/analog device, a sensor/MEMS device, a power semiconductor or a bio device. The first semiconductor chip 110 may have a thickness of about 5 μm to about 1 mm.

A dielectric layer 118 may be formed on the upper surface of the first semiconductor chip 110. The dielectric layer 118 may be formed to expose the upper pad 116.

A first underfill resin 130 may be formed between the package substrate 100 and the first semiconductor chip 110. For example, the first underfill resin 130 may fill an empty space between the package substrate 100 and the first semiconductor chip 110. Accordingly, the first underfill resin 130 may be in contact with the surfaces of the pad 102, the lower pad 112, and the first solder ball 113. The first underfill resin 130 may have a certain viscosity in order to fill the empty space. For example, the first underfill resin 130 may be a non conductive film (NCF) or a non-conductive paste (NCP). The first underfill resin 130 may be formed to have a thickness of about 2 μm to about 100 μm.

The first underfill resin 130 may include a thermosetting resin, a reducing agent, and a hardener. The thermosetting resin may include e.g., a Bisphenol A-type epoxy resin (e.g., diglycidyl ether of brominated bisphenol-A (DGEBA), a tetrafunctional epoxy resin (e.g., tetraglycidyl diarmine diphenyl methane (TGDDM)), isocyanate, bismaleimide, a silicon-based resin or acryl resin. The reducing agent may be acid including a carboxyl group COO. For example, the reducing agent may include glutaric acid, malic acid, azelaic acid), abietic acid, adipic acid, ascorbic acid, acrylic acid or citric acid. The hardener is a material that may cause a curing reaction with the thermosetting resin. For example, the hardener may include carboxyl group COOH— or amino group —NH.

Figure 1C:
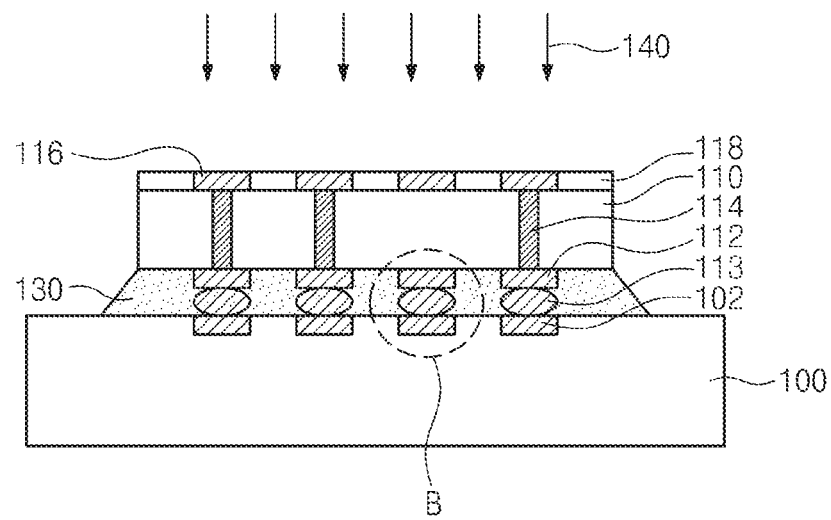
Figure 1D:
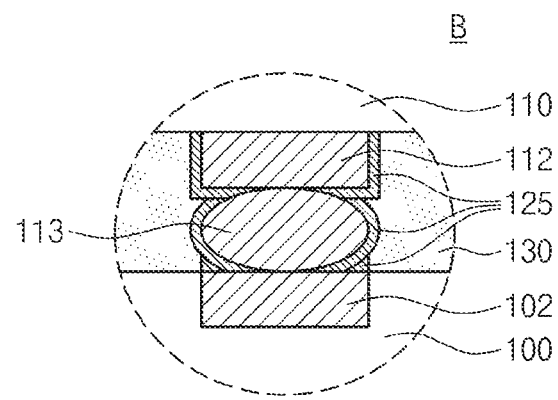
FIG. 1D is an enlarged view of portion B of FIG. 1B.

Referring to FIG. 1C, a laser 140 may be irradiated to the first semiconductor chip 110. The laser 140 may be irradiated to the upper and/or lower part of the first semiconductor chip 110. Some of the laser 140 may be absorbed into the first semiconductor chip 110, the first solder ball 113, and the pad 102 to be changed to heat. The heat may be transferred to the first solder ball 113 and the pad 102 to bond the first solder ball 113 and the pad 102. In addition, the first underfill resin 130 may be cured due to the heat. The laser 140 may be e.g., a helium-neon laser, an argon laser, an ultra violet (UV) laser, an infrared laser or excimer laser. The laser 140 may have a wavelength of about 500 nm to about 2 μm. The heat generated by the laser 140 may have the temperature of the melting point of a solder ball to a 100° C. higher temperature than the melting temperature of the solder ball. In particular, the heat generated by the laser 140 may have a temperature of about 130° C. to about 270° C. The temperature may vary according to an amount of irradiation of the laser 140 and/or an intensity of irradiation of the laser 140.

By the heat generated by the laser 140, the reducing agent of the first underfill resin 130 may be oxidized, and the metal oxide layers 120 on some surfaces of the pad 102, the first solder ball 113, and the lower pad 112 may be reduced. The reduction of the metal oxide layer 120 may include changing the metal oxide layer 120 to a metal layer 125. In particular, the metal layer 125 formed on the surface of the pad 102 may include the same material as a metal material in the pad 102, the metal layer 125 formed on the surface of the first solder ball 113 may include the same material as a metal material in the first solder ball 113, and the metal layer 125 formed on the surface of the lower pad 112 may include the same material as a metal material in the lower pad 112. Thus, as shown in FIG. 1D, the metal oxide layers 120 may be removed from some surfaces of the pad 102, the first solder ball 113, and the lower pad 112.

Figure 1E:
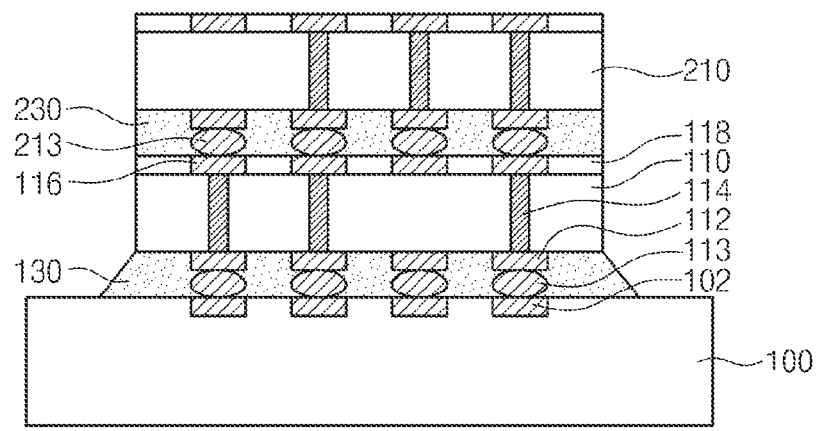
Figure 1F:
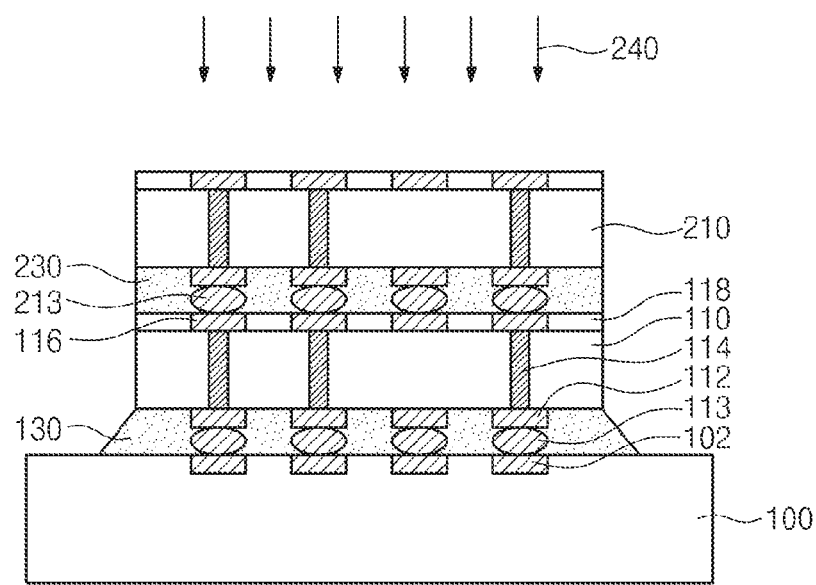

In the processes of FIGS. 1E and 1F to be described below, the same components as those in FIGS. 1A and 1C are not described in detail.

Referring to FIG. 1E, a second underfill resin 230 may be formed on the upper surface of the first semiconductor chip 110. The second underfill resin 230 may be formed to cover the upper pad 116. The second underfill resin 230 may include a thermosetting resin, a reducing agent, and a hardener.

A second semiconductor chip 210 may be mounted on the first semiconductor chip 110. Mounting the second semiconductor chip 210 on the first semiconductor chip 110 may include disposing a second solder ball 213, which is disposed on a lower surface of the the second semiconductor chip 210, on the upper pad 116. Thus, the second solder ball 213 and the upper pad 116 may be in contact with each other and the second underfill resin 230 may cover the surfaces of the second solder ball 213 and the upper pad 116.

Before the second semiconductor chip 210 is mounted on the first semiconductor chip 110, the metal oxide layers 120 (see FIG. 1B) that are obtained by the combination of the metal ions of the upper pad 116 and the second solder ball 213 with an oxygen ion in the air may be formed on the surfaces of the upper pad 116 and the second solder ball 213.

Referring to FIG. 1F, a laser 240 may be irradiated to the second semiconductor chip 210. The laser 240 may be irradiated to the upper and/or lower part of the second semiconductor chip 210. Some of the laser 240 may be absorbed into the second semiconductor chip 210, the upper pad 116, and the second solder ball 213 to be changed to heat. The heat may be transferred to the second solder ball 213 and the upper pad 116 to bond the second solder ball 213 and the upper pad 116. In addition, the second underfill resin 230 may harden due to the heat. In this case, the reducing agent in the second underfill resin 230 may be oxidized and the metal oxide layers 120 (see FIG. 1B) formed on the surfaces of the upper pad 116 and the second solder ball 213 may be reduced. Thus, the metal oxide layer 120 may be changed to the metal layer 125 (see FIG. 1D).

Figure 1G:
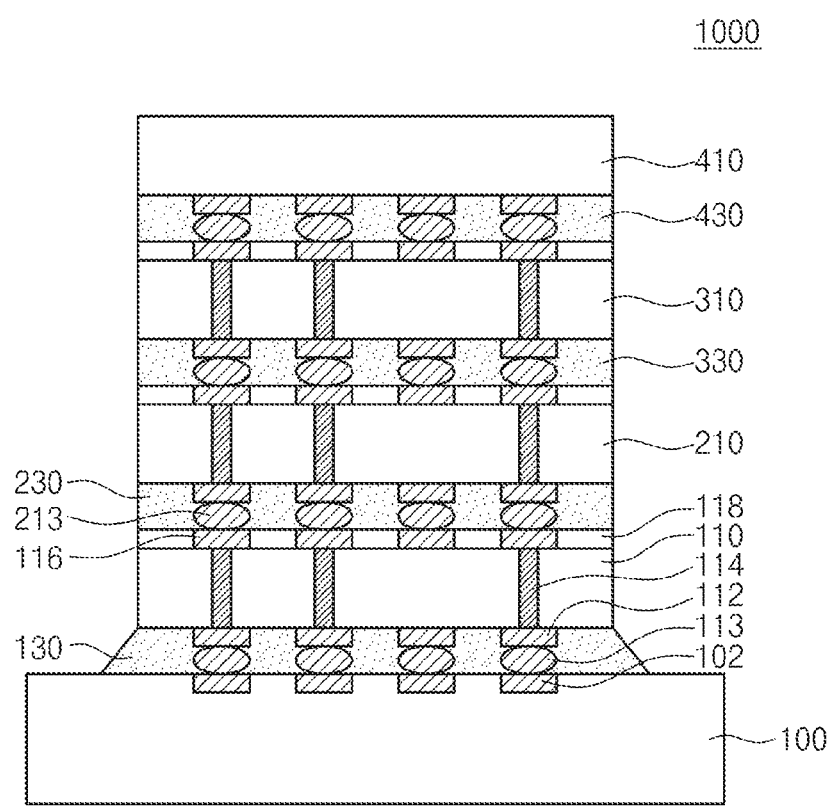

Referring to FIG. 1G, by repeating the processed as described in FIGS. 1A, 1C, 1E and 1F, a third underfill resin 330, a third semiconductor chip 310, a fourth underfill resin 430, and a fourth semiconductor chip 410 are sequentially formed on the second semiconductor chip 210 to fabricate a semiconductor package 1000.

Figure 2A:
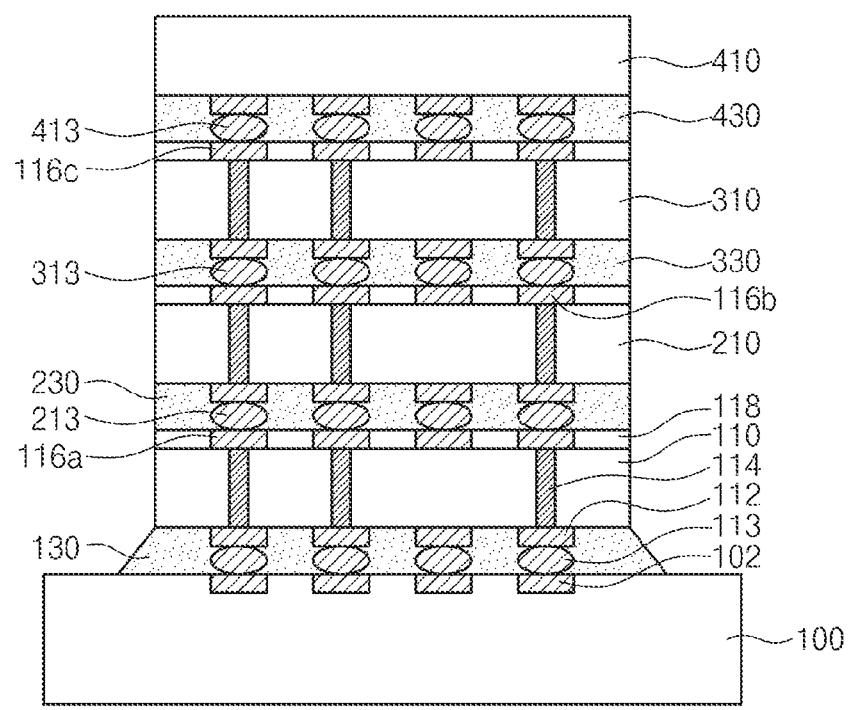
FIGS. 2A to 2C are cross-sectional views of a method of fabricating a semiconductor package according to an embodiment of the present disclosure.
Figure 2B:
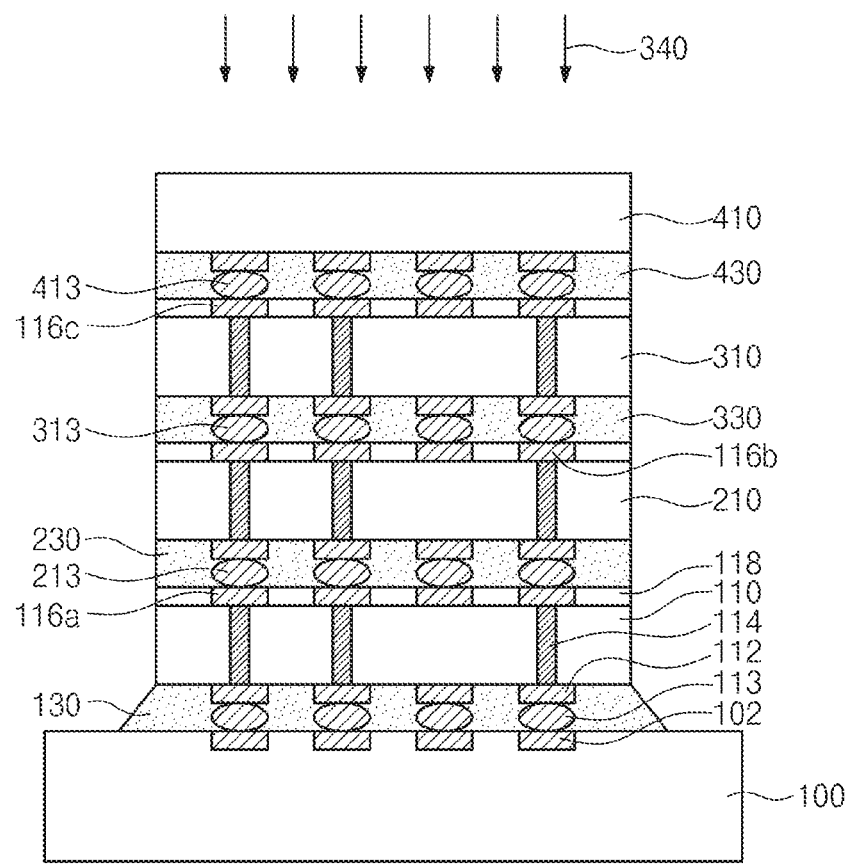
Figure 2C:
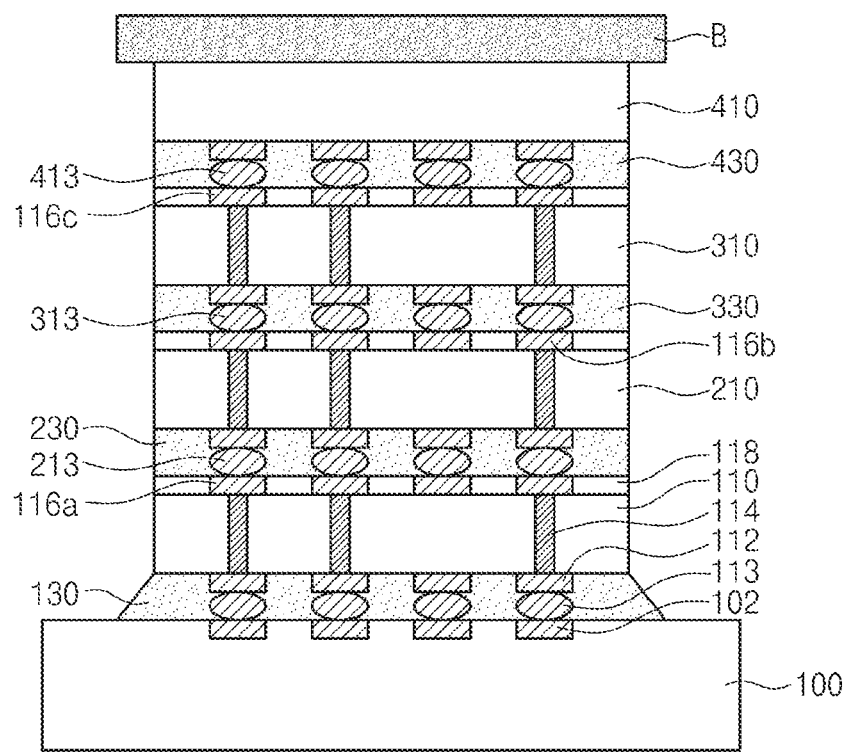

FIGS. 2A to 2C are cross-sectional views of a method of fabricating a semiconductor package according to an embodiment of the present disclosure. For the simplicity of description, in embodiments of FIGS. 2A and 2B, substantially the same components as those in embodiments of FIGS. 1A to 1G use the same reference numerals, and descriptions of corresponding components are omitted.

Referring to FIG. 2A, the first semiconductor chip 110 may be mounted on the package substrate 100. Mounting the first semiconductor chip 110 on the package substrate 100 may include disposing the first solder ball 113, which is disposed on the lower surface of the first semiconductor chip 110, on the pad 102 that is disposed on the upper surface of the package substrate 100. Thus, the first solder ball 113 and the pad 102 may be in contact with each other. The metal oxide layer 120 (see FIG. 1B) may be formed on some of the surfaces of the first solder ball 113 and the pad 102.

The first underfill resin 130 may be formed between the package substrate 100 and the first semiconductor chip 110. The first underfill resin 130 may fill an empty space between the package substrate 100 and the first semiconductor chip 110. The first underfill resin 130 may include a thermosetting resin, a reducing agent, and a hardener.

The second semiconductor chip 230 may be disposed onr the first semiconductor chip 110. The second underfill resin 230 may cover a first upper pad 116a on the upper surface of the first semiconductor chip 110. The second underfill resin 230 may include a thermosetting resin, a reducing agent, and a hardener.

The second semiconductor chip 210 may be mounted on the first semiconductor chip 110. Mounting the second semiconductor chip 210 on the first semiconductor chip 110 may include disposing a second solder ball 213, which is disposed on the lower surface of the second semiconductor chip 210, on a first upper pad 116a that is disposed on the upper surface of the first semiconductor chip 110. Thus, the second solder ball 213 and the first upper pad 116a may be in contact with each other and the second underfill resin 230 may cover the surface of the second solder ball 213. The metal oxide layer 120 (see FIG. 1B) may be formed on some of the surfaces of the second solder ball 213 and the first upper pad 116a.

The third underfill resin 330 may be formed on the second semiconductor chip 210. The third underfill resin 330 may cover a second upper pad 116b disposed on the upper surface of the second semiconductor chip 210. The third underfill resin 330 may include a thermosetting resin, a reducing agent, and a hardener.

The third semiconductor chip 310 may be mounted on the second semiconductor chip 210. Mounting the third semiconductor chip 310 on the second semiconductor chip 210 may include disposing the third solder ball 313, which is disposed the lower surface of the third semiconductor chip 310, on the second upper pad 116b that is disposed on the upper surface of the second semiconductor chip 210. Thus, the third solder ball 313 and the second upper pad 116b may be in contact with each other and the third underfill resin 330 may cover the surface of the third solder ball 313. The metal oxide layer 120 (see FIG. 1B) may be formed on some of the surfaces of the third solder ball 313 and the second upper pad 116b.

The fourth underfill resin 430 may be formed on the third semiconductor chip 310. The fourth underfill resin 430 may cover a third upper pad 116c disposed on the upper surface of the third semiconductor chip 310. The third underfill resin 330 may include a thermosetting resin, a reducing agent, and a hardener.

The fourth semiconductor chip 410 may be mounted on the third semiconductor chip 310. Mounting the third semiconductor chip 410 on the third semiconductor chip 310 may include disposing the fourth solder ball 413, which is disposed on the lower surface of the fourth semiconductor chip 410, on the third upper pad 116c that is disposed on the upper surface of the third semiconductor chip 310. Thus, the fourth solder ball 413 and the third upper pad 116c may be in contact with each other and the fourth underfill resin 430 may cover the surface of the fourth solder ball 413. The metal oxide layer 120 (see FIG. 1B) may be formed on some of the surfaces of the fourth solder ball 413 and the third upper pad 116c.

Referring to FIG. 2B, the laser 340 may be irradiated to the first to fourth semiconductor chips 110 to 410 stacked on the package substrate 100. The laser 430 may be irradiated to the upper part of the fourth semiconductor chip 410 and/or the lower part of the first semiconductor chip 110. Some portion of the laser 340 may be absorbed into the first to fourth semiconductor chips 110 to 410, the first to fourth solder balls 113 to 413, and the pads 102, 112, and 116a to 116c to be changed to heat. The heat may bond the pad 102 to the first solder ball 113, the first upper pad 116a to the second solder ball 213, the second upper pad 116b to the third solder ball 313, and the third upper pad 116c to the fourth solder ball 413. In addition, due to the heat, the first to fourth underfill resins 130 to 430 may be cured. In addition, the heat may oxidize the reducing agents in the first to fourth underfill resins (130, 230, 330, 430) and reduce the metal oxide layer 120 (see FIG. 1B) formed on some of the surfaces of the pad 102, the first to third upper pads 116a, 116b, 116c, and the first to fourth solder balls 113, 213, 313, 413. That is, the metal oxide layer 120 (see FIG. 1B) may be changed to the metal layer 125 (see FIG. 1D).

As another example, a quartz block B may be provided on the fourth semiconductor chip 410 while irradiating the first to fourth semiconductor chips 110, 210, 310, 410 with the laser 340 as shown in FIG. 2C. By using the quartz block B, it is possible to apply pressure to the first to fourth semiconductor chips 110, 210, 310, 410. The quartz block B may prevent the warpage of the first to fourth semiconductor chips 110, 210, 310, 410 that have a small thickness during the process.

Figure 3A:
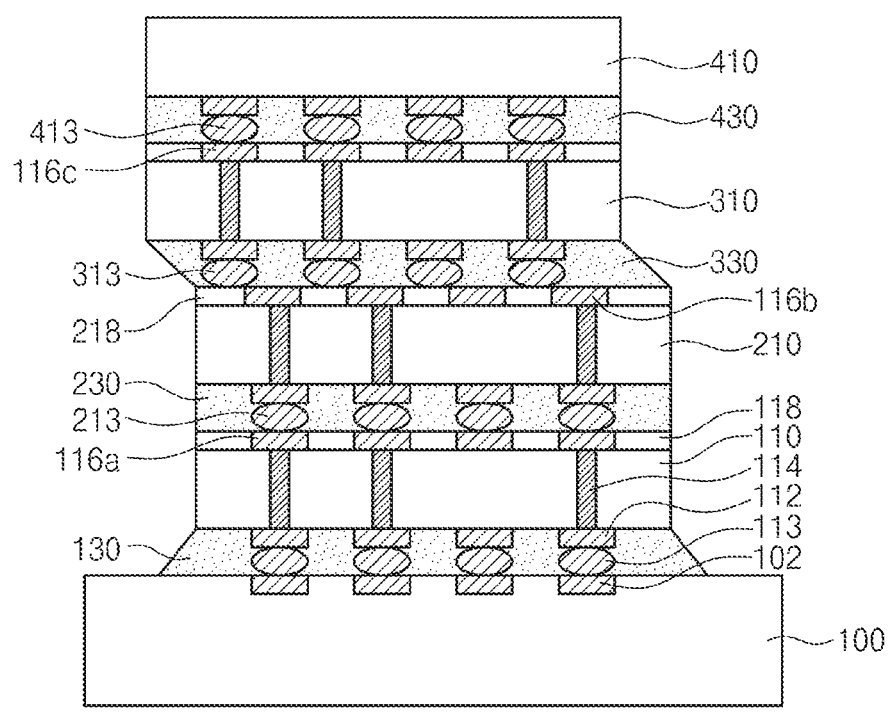
FIGS. 3A to 3C are cross-sectional views of a method of fabricating a semiconductor package according to an embodiment of the present disclosure.
Figure 3B:
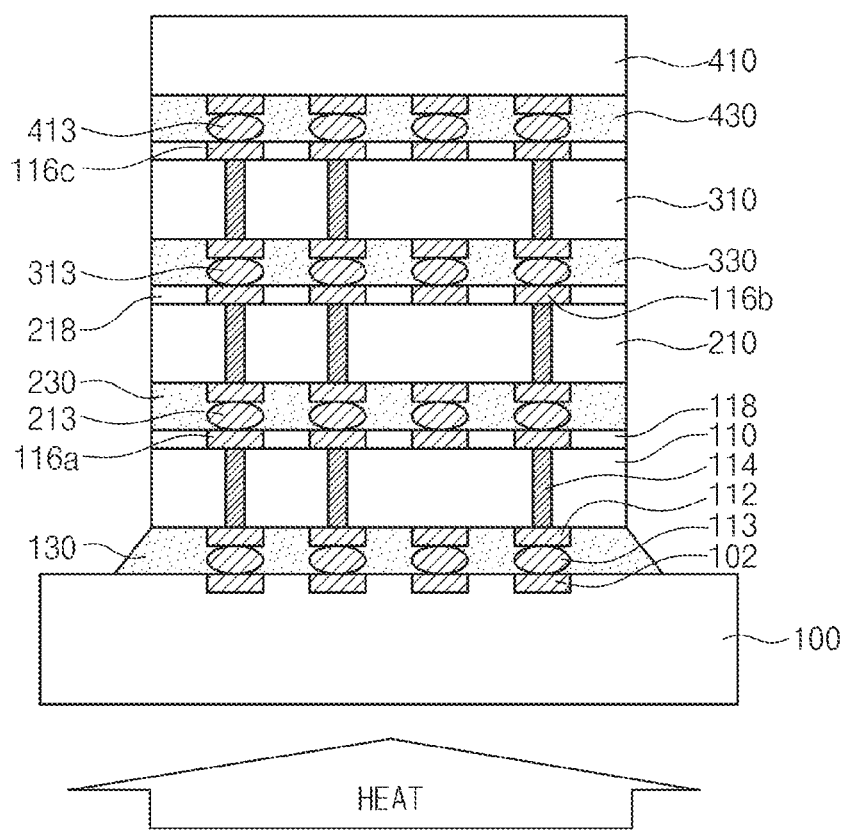
Figure 3C:
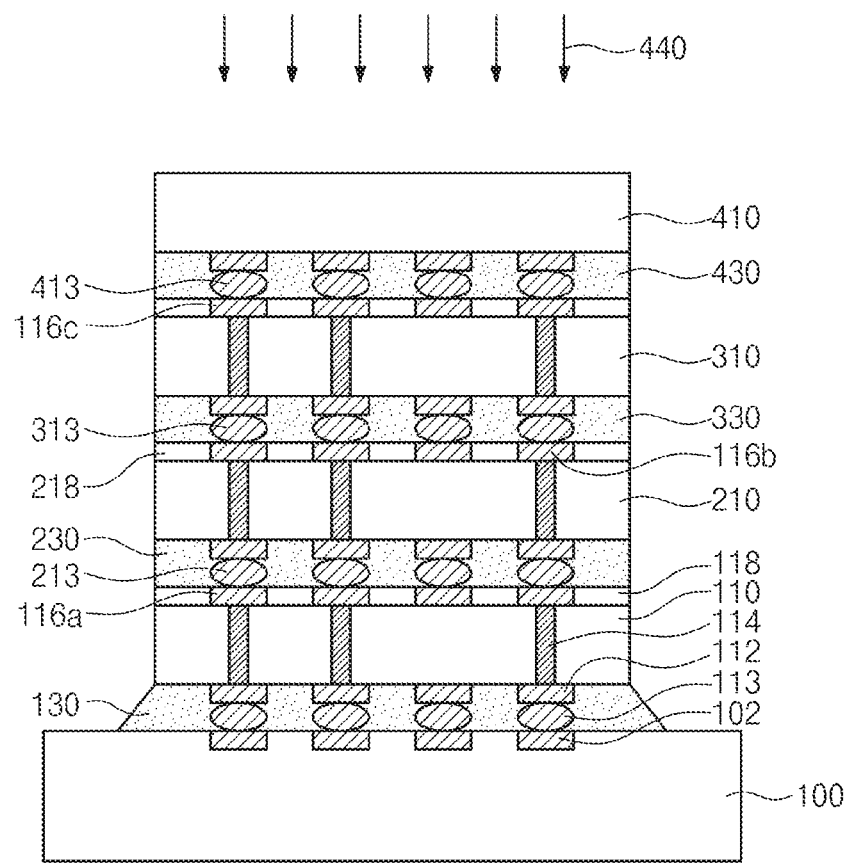

FIGS. 3A to 3C are cross-sectional views of a method of fabricating a semiconductor package according to an embodiment of the present disclosure. For the simplicity of description, in embodiments of FIGS. 3A to 3C, substantially the same components as those in embodiments of FIGS. 1A to 1G and FIGS. 2A and 2B use the same reference numerals, and descriptions of corresponding components are omitted.

Referring to FIG. 3A, the first to fourth semiconductor chips 110 to 410 may be sequentially stacked on the package substrate 100. The first underfill resin 130 may be formed between the package substrate 100 and the first semiconductor chip 110, the second underfill resin 230 may be formed between the first semiconductor chip 110 and the second semiconductor chip 210, the third underfill resin 330 may be formed between the second semiconductor chip 210 and the third semiconductor chip 310, and the fourth underfill resin 430 may be formed between the third semiconductor chip 310 and the fourth semiconductor chip 410.

As shown in FIG. 3A, the third solder ball 313 of the third semiconductor chip 310 may be in contact with a dielectric layer 218 formed on the second semiconductor chip 210 without a contact with the second upper pad 116b of the second semiconductor chip 210. That is, the third solder ball 313 and the second upper pad 116b may be misaligned to each other. As a result, the first to fourth semiconductor chips 110, 210, 310, 410 may not be stacked on the package substrate in a line in terms of a cross-sectional view. As an example, the third and fourth semiconductor chips 310 and 410 may be twisted from the first and second semiconductor chips 110 and 210.

Referring to FIG. 3B, it is possible to apply heat to the package substrate 100. The heat may be transferred to the first to fourth underfill resins 130, 230, 330, 430. The heat may have a temperature of about 50° C. to about 180° C. The temperature ranged from about 50° C. to about 180° C. may decrease the viscosity of the first to fourth underfill resins 130, 230, 330, 430.

As the viscosity of the first to fourth underfill resins 130, 230, 330, 430 decreases, the first to fourth underfill resins 130, 230, 330, 430 may have mobility. That is, the first to fourth semiconductor chips 110, 210, 310, 410 may move to the left and right on the surfaces on which they are placed. In this case, the third solder ball 313 that is in contact with the dielectric 218 on the upper surface of the second semiconductor chip 210 may be in contact with the second upper pad 116b to decrease surface tension. Thus, the third semiconductor chip 310 may move so that the third solder ball 313 is disposed on the second upper pad 116b. As a result, the first to fourth semiconductor chips 110, 210, 310, 410 may be stacked on the package substrate in a line in terms of a cross-sectional view.

Referring to FIG. 3C, a laser 440 may be irradiated to the first to fourth semiconductor chips 110 to 410 stacked on the package substrate 100. The laser 440 may be irradiated to the upper part of the fourth semiconductor chip 410 and/or the lower part of the first semiconductor chip 110. Some portion of laser 440 may be absorbed into the first to fourth semiconductor chips 110, 210, 310, 410, the first to fourth solder balls 113, 213, 313, 413, and the pads 102, 112, and 116a to 116c to be changed to heat. The heat may bond the pad 102 to the first solder ball 113, the first upper pad 116a to the second solder ball 213, the second upper pad 116b to the third solder ball 313, and the third upper pad 116c to the fourth solder ball 413.

The heat generated by the laser 440 may have a temperature of about 130° C. to about 270° C. The temperature ranged from about 130° C. to about 270° C. may be a temperature that may causes curing reactions to the first to fourth underfill resins 130, 210, 310 430. Thus, the first to fourth underfill resins 130, 230, 330, 430 may be hardened, and the first to fourth semiconductor chips 110, 201, 310, 410 may be fixed in a stacked state in a line on the package substrate 100.

Figure 4A:
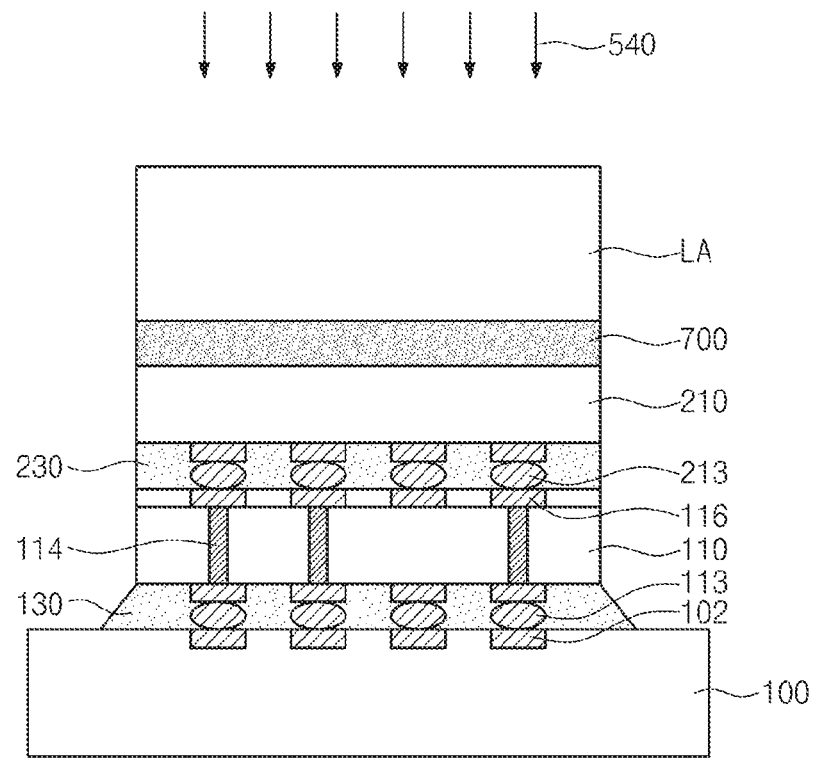
FIGS. 4A to 4B are cross-sectional views of a method of fabricating a semiconductor package according to an embodiment of the present disclosure.
Figure 4B:
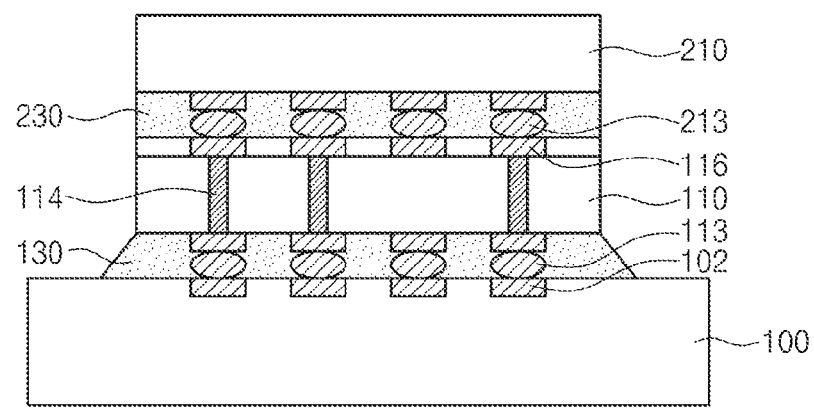

FIGS. 4A and 4B are cross-sectional views of a method of fabricating a semiconductor package according to an embodiment of the present disclosure. For the simplicity of description, in embodiments of FIGS. 4A and 4B, substantially the same components as those in embodiments of FIGS. 1A to 1G use the same reference numerals, and descriptions of corresponding components are omitted.

Referring to FIG. 4A, the first and second semiconductor chips 110 and 210 may be sequentially stacked on the package substrate 100. In addition, the first underfill resin 130 may be formed between the package substrate 100 and the first semiconductor chip 110, and the second underfill resin 230 may be formed between the first semiconductor chip 110 and the second semiconductor chip 210.

A laser absorbing layer LA may be provided on the second semiconductor chip 210. The laser absorbing layer LA may bond to the upper surface of the second semiconductor chip 210 by a bonding layer 700. The laser absorbing layer LA may be e.g., a silicon layer, a metal layer, or a carbon steel layer. The bonding layer 700 may be a bonding film having good thermal conductivity and include e.g., polyethylene terephthalate (PET) or polycarbonate (PC).

The laser 540 may be irradiated to the first and second semiconductor chips 110 and 210. The laser 540 may be irradiated to the upper part of the laser absorbing layer LA and/or the lower part of the first semiconductor chip. Some portion of the laser 540 may be absorbed into the laser absorbing layer LA. The laser 540 that is not absorbed into the laser absorbing layer LA may be absorbed into the first and second semiconductor chips 110 and 120, the first and second solder balls 113 and 213, and the pads 102 and 116 to be changed to heat. The heat may bond the first solder ball 113 to the pad 102, and the second solder ball 213 to the upper pad 116.

The devices in the first and second semiconductor chips 110 and 210 may generally be damaged by the laser 540 and thus cause an error or malfunction. According to the embodiment, the laser absorbing layer LA may absorb some portion of the laser 540 so that they do not arrive at the devices. Thus, the characteristic of the device does not vary due to the laser 540.

FIG. 4B, the laser absorbing layer LA may be removed after a laser process ends. The laser absorbing layer LA may be removed through the detachment of the bonding layer 700 by chemical or physical application to the bonding layer 700.

Figure 5:
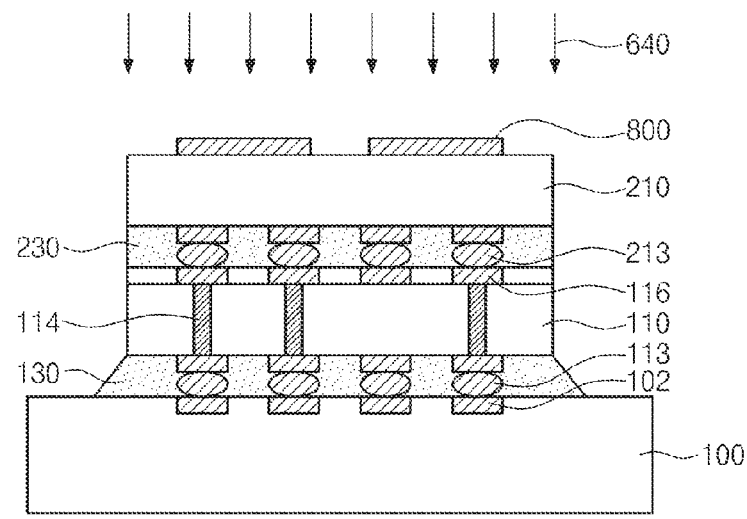
FIG. 5 is a cross-sectional view of a method of fabricating a semiconductor package according to an embodiment of the present disclosure.

FIG. 5 is a cross-sectional view of a method of fabricating a semiconductor package according to an embodiment of the present disclosure. For the simplicity of description, in embodiments of FIG. 5, substantially the same components as those in embodiments of FIGS. 4A and 4B use the same reference numerals, and descriptions of corresponding components are omitted.

Referring to FIG. 5, a laser reflecting layer 800 may be disposed on the second semiconductor chip 210. The laser reflecting layer 800 may be disposed locally on portions of the first and second semiconductor chips 110 and 210 in which laser-sensitive devices are disposed. Thus, the laser reflecting layer 800 may reflect a laser so that the laser is not transferred directly to the device. The laser reflecting layer 800 may include a metal material (e.g., copper (Co) or aluminum (Al)).

The laser 640 may be irradiated to the first and second semiconductor chips 110 and 210 having the laser reflecting layer 800. The laser 640 may be irradiated to some regions of the semiconductor chips on which the laser reflecting layer 800 is not disposed, and changed to heat. The heat generated by the laser 640 may bond the first solder ball 113 to the pad 102, and the second solder ball 213 to the upper pad 116. After the laser process is performed, the laser reflecting layer 800 may not be removed.

Figure 6:
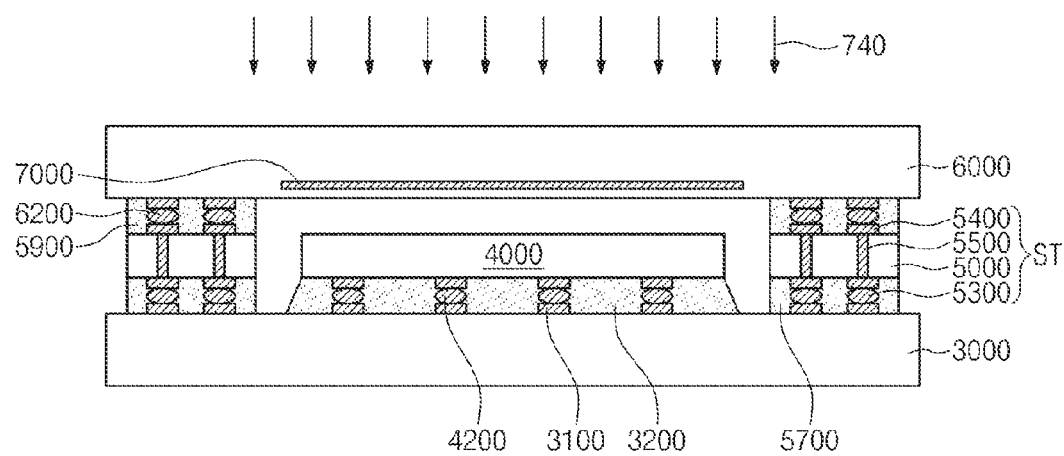
FIG. 6 is a cross-sectional view of a method of fabricating a semiconductor package according to an application of the present disclosure.

FIG. 6 is a cross-sectional view of a method of fabricating a semiconductor package according to an application of the present disclosure.

Referring to FIG. 6, a first substrate 3000 may be provided. The first substrate 3000 may be e.g., a PCB or silicon substrate. A semiconductor chip 4000 may be mounted on the first substrate 3000. Specifically, it is possible to mount a semiconductor chip 4000 on the first substrate 3000 such that chip solder balls 4200 bonded on a lower surface of the semiconductor chip 4000 are disposed on pads 3100 that are disposed on an upper surface of the first substrate 3000.

A first underfill resin 3200 may be formed between the first substrate 3000 and the semiconductor chip 4000. The first underfill resin 3200 may fill an empty space between the first substrate 3000 and the semiconductor chip 4000. The first underfill resin 3200 may include a thermosetting resin, a reducing agent, and a hardener.

Connections (ST) may be disposed on an edge portion of the first substrate 3000 that is the circumference of the central portion of the first substrate 3000. The connections ST may include a body part 5000, lower solder balls 5300 bonded on a lower surface of the body part 5000, chip pads 5400 disposed on the upper surface of the body part 5000, and vias 5500 passing through the body part 5000 to connect the lower solder balls 5300 and the chip pads 5400. The connections ST may be disposed on the first substrate 3000 such that the lower solder balls 5300 are disposed on the pads 3100 of the first substrate 3000. The body part 5000 may include a dielectric material or copper clad laminate (CCL). The lower solder balls 5300 may include a conductive material (e.g., tin (Sn)). The vias 5500 may be TSVs.

A second underfill resin 5700 may be formed between the connections ST and the first substrate 3000. The second underfill resin 5700 may fill an empty space between the first substrate 3000 and the connections ST. The second underfill resin 5700 may be formed together when the first underfill resin 3200 is formed or through a separate process after the first underfill resin 3200 is formed. The second underfill resin 5700 may include the same material as the first underfill resin 3200.

A third underfill resin 5900 may be formed on the connections ST. The third underfill resin 5900 may cover the upper surfaces of the connections ST. The third underfill resin 5900 may include the same material as the second underfill resin 5700.

A second substrate 6000 may be mounted on the connections ST. The second substrate 6000 may be mounted on the connections ST such that top solder balls 6200 bonded a lower surface of the second substrate 6000 are disposed on the chip pads 5400. Thus, the surface of the top solder balls 6200 may be covered with the third underfill resin 5900.

The second substrate 6000 may be an interposer substrate. The second substrate 6000 may include a laser reflecting layer 7000. For example, the laser reflecting layer 7000 may be disposed in the second substrate 6000. The laser reflecting layer 7000 may include a metal material (e.g., copper (Co) or aluminum (Al)).

Laser 740 may be irradiated to the first substrate 3000, the connections ST, and the second substrate 6000. The heat generated by the laser 740 may bond the pads 3100 to the chip solder balls 4200, the pads 3100 to the lower solder balls 5300, and the chip pads 5400 to the top solder balls 6200. The laser reflecting layer 7000 in the second substrate 6000 may reflect some of the laser 740 such that the laser 740 may not be irradiated directly to devices in the semiconductor chip 4000.

The method of fabricating the semiconductor package of the present disclosure may include bonding the pad to the solder ball by using the heat generated by the laser. In this case, the heat may oxidize the reducing agent in the underfill resin and reduce the metal oxide layers on the surfaces of the pad and the solder ball. Thus, since the metal oxide layer is changed to a metal layer, the metal oxide layers on the surfaces of the solder ball and the pad may be removed.

While embodiments of the present disclosure are described with reference to the accompanying drawings, a person skilled in the art may understand that the present disclosure may be practiced in other particular forms without changing technical spirits or essential characteristics. Therefore, embodiments described above should be understood as illustrative and not limitative in every aspect.

What is claimed is:

1. A method of fabricating a semiconductor package, the method comprising:
   providing a package substrate including a pad;
   mounting a semiconductor chip with a solder ball on the package substrate to allow the solder ball to be disposed on the pad;
   filling a space between the package substrate and the semiconductor chip with an underfill resin, the underfill resin including a reducing agent comprising a carboxyl group; and
   irradiating the semiconductor chip with a laser to heat the semiconductor chip, heat of the semiconductor chip being transferred to the solder ball and the pad to thereby bond the solder ball to the pad and to cure the underfill resin,
   wherein the bonding of the solder ball to the pad comprises changing a metal oxide layer formed on surfaces of the pad and the solder ball to a metal layer due to heat generated by the laser.

2. The method of claim 1, wherein the reducing agent is glutaric acid, malic acid, azelaic acid, abietic acid, adipic acid, ascorbic acid, acrylic acid or citric acid.

3. The method of claim 1, wherein the underfill resin further comprises a thermosetting resin and a hardener.

4. The method of claim 1, wherein the heat generated by the laser has a temperature of about 130° C. to about 270° C.

5. The method of claim 1, wherein the bonding of the solder ball to the pad further comprising applying pressure to the semiconductor chip.

6. The method of claim 1, wherein the laser is irradiated to upper and/or lower portions of the semiconductor chip.

7. The method of claim 1, wherein the laser has a wavelength of about 500 nm to about 2μm.

8. The method of claim 1, further comprising, after the bonding of the solder ball to the pad,
   forming another underfill resin on the semiconductor chip to cover a chip pad disposed on an upper surface of the semiconductor chip;
   mounting another semiconductor chip with another solder ball on the semiconductor chip to allow the another solder ball to be disposed on the chip pad; and
   bonding the another solder ball to the chip pad by using heat generated by a laser irradiated to the another semiconductor chip.

9. A method of fabricating a semiconductor package, the method comprising:
   providing a package substrate including a pad;
   mounting a semiconductor chip with a solder ball on the package substrate to allow the solder ball to be disposed on the pad;
   filling a space between the package substrate and the semiconductor chip with an underfill resin, the underfill resin including a reducing agent comprising a carboxyl group;
   irradiating the semiconductor chip with a laser to bond the solder ball to the pad, the bonding of the solder ball to the pad including changing a metal oxide layer formed on surfaces of the pad and the solder ball to a metal layer due to heat generated by the laser; and
   after the bonding of the solder ball to the pad,
      forming another underfill resin on the semiconductor chip to cover a chip pad disposed on an upper surface of the semiconductor chip;
      mounting another semiconductor chip with another solder ball on the semiconductor chip;
      applying heat to the package substrate to decrease viscosity of the another underfill resin and aligning the another semiconductor chip with the semiconductor chip to allow the another solder ball to be disposed on the chip pad; and
      bonding the another solder ball to the chip pad by using heat generated by laser irradiated to the another semiconductor chip.

10. The method of claim 9, wherein the bonding of the another solder ball to the chip pad comprises increasing the decreased viscosity of the another underfill resin.

11. The method of claim 9, wherein the heat applied to the package substrate has a temperature of about 50° C. to about 180° C., and
   the heat generated by the laser has a temperature of about 130° C. to about 270° C.

12. The method of claim 1, further comprising, before the bonding of the solder ball to the pad, providing a laser reflecting layer on an upper surface of the semiconductor chip.

13. The method of claim 12, wherein the laser reflecting layer comprises a metal material.

14. The method of claim 1, further comprising, before the bonding of the solder ball to the pad,
   forming a bonding layer on an upper surface of the semiconductor chip; and
   forming an absorbing layer on the bonding layer.

15. The method of claim 1, wherein the changing of the metal oxide layer to the metal layer comprises oxidizing the reducing agent by the heat to reduce the metal oxide layer.

* * * * *